(12) United States Patent
Kirk

(10) Patent No.: US 8,498,127 B2
(45) Date of Patent: Jul. 30, 2013

(54) THERMAL INTERFACE MATERIAL FOR REDUCING THERMAL RESISTANCE AND METHOD OF MAKING THE SAME

(75) Inventor: Graham Charles Kirk, Milton Keynes (GB)

(73) Assignee: GE Intelligent Platforms, Inc., Charlottesville, VA (US)

( * ) Notice: Subject to any disclaimer, the term of this patent is extended or adjusted under 35 U.S.C. 154(b) by 219 days.

(21) Appl. No.: 12/879,766

(22) Filed: Sep. 10, 2010

(65) Prior Publication Data

US 2012/0063103 A1    Mar. 15, 2012

(51) Int. Cl.
*H05K 5/00* (2006.01)

(52) U.S. Cl.
USPC ........... 361/756; 174/257; 136/201; 136/230; 228/122.1; 228/191; 228/205; 257/692; 257/693; 257/707; 257/712; 428/122; 428/450; 428/615

(58) Field of Classification Search
USPC   361/756; 174/257; 136/201, 230; 228/122.1, 228/191, 205; 257/692, 693, 707, 712; 428/122, 428/450, 615
See application file for complete search history.

(56) References Cited

U.S. PATENT DOCUMENTS

| | | | | |
|---|---|---|---|---|
| 5,522,535 A * | 6/1996 | Ivanov et al. | ............... | 228/122.1 |
| 5,965,278 A * | 10/1999 | Finley et al. | ................... | 428/641 |
| 6,504,242 B1 * | 1/2003 | Deppisch et al. | ............ | 257/707 |
| 6,518,667 B1 * | 2/2003 | Ichida et al. | ................... | 257/738 |
| 6,644,395 B1 | 11/2003 | Bergin | | |
| 7,955,900 B2 * | 6/2011 | Jadhav et al. | ................. | 438/122 |
| 2001/0002066 A1 * | 5/2001 | Mita et al. | ...................... | 257/693 |
| 2001/0029975 A1 * | 10/2001 | Takeyama et al. | ............ | 136/244 |
| 2001/0029976 A1 * | 10/2001 | Takeyama et al. | ............ | 136/244 |
| 2002/0192488 A1 * | 12/2002 | Kurihara et al. | .............. | 428/621 |
| 2004/0014317 A1 * | 1/2004 | Sakamoto et al. | ............ | 438/689 |
| 2005/0140004 A1 * | 6/2005 | Ishiguri et al. | ................ | 257/737 |
| 2005/0280142 A1 * | 12/2005 | Hua et al. | ...................... | 257/707 |
| 2006/0258045 A1 * | 11/2006 | Ishiguri et al. | ................ | 438/106 |
| 2006/0289052 A1 * | 12/2006 | O'Quinn et al. | .............. | 136/230 |
| 2007/0145546 A1 | 6/2007 | Lewis | | |
| 2007/0215194 A1 * | 9/2007 | Bharathan et al. | ............ | 136/230 |
| 2007/0257364 A1 | 11/2007 | Van Heerden et al. | | |
| 2007/0284737 A1 | 12/2007 | Too | | |
| 2008/0038871 A1 | 2/2008 | Chiu et al. | | |
| 2008/0063889 A1 * | 3/2008 | Duckham et al. | ............. | 428/615 |
| 2008/0153210 A1 * | 6/2008 | Hua et al. | ...................... | 438/122 |
| 2008/0166835 A1 * | 7/2008 | Yen et al. | ...................... | 438/107 |
| 2010/0112353 A1 * | 5/2010 | Sun et al. | ...................... | 428/407 |
| 2010/0112360 A1 * | 5/2010 | Delano | ......................... | 428/450 |
| 2011/0067908 A1 * | 3/2011 | Weichslberger et al. | ..... | 174/257 |
| 2011/0147916 A1 * | 6/2011 | Su | .................................. | 257/692 |
| 2011/0162828 A1 * | 7/2011 | Kirk et al. | ...................... | 165/185 |
| 2012/0063103 A1 * | 3/2012 | Kirk | .................................. | 361/756 |

OTHER PUBLICATIONS

EP Search Report issued in connection with corresponding EP Patent Application No. 11180284.9 filed on Sep. 6, 2011.
Correspondence from EP 11 180 284.9 mailed Nov. 9, 2012.

* cited by examiner

*Primary Examiner* — Xiaoliang Chen
(74) *Attorney, Agent, or Firm* — Global Patent Operation; Mark A. Conklin

(57) ABSTRACT

The thermal interface material including a thermally conductive metal a thermally conductive metal having a first surface and an opposing second surface, a diffusion barrier plate coupled to the first surface of the thermally conductive metal and the second surface of the thermally conductive metal, and a thermal resistance reducing layer coupled to the diffusion barrier plate.

17 Claims, 5 Drawing Sheets

THERMAL INTERFACE MATERIAL FOR REDUCING THERMAL RESISTANCE AND METHOD OF MAKING THE SAME

BACKGROUND OF THE INVENTION

The subject matter described herein relates generally to a thermal interface material, and, more particularly, a thermal interface material for reducing thermal resistance between a circuit card assembly (CCA) and a chassis.

Enclosures designed to remove heat from a CCA by way of thermal conduction, such as those assemblies containing high power devices, are increasingly challenged to remove higher levels of heat. This is because newly developed processing devices typically contain more circuitry and therefore tend to generate higher heat loads, or because components are smaller, thus permitting a CCA to contain more components, thereby increasing an amount of heat generated per CCA.

Various systems have been devised for pressing, via a board retainer, opposite edges of the thermal interface of a CCA to a chassis which acts as a heat sink to carry away heat generated by CCA components on opposite sides of the thermal interface. However, currently, a thermal interface between a CCA and a chassis is metal to metal without a thermal intermediate material between the two metals. The metal to metal interface is poor thermally, with a typical difference in temperature ($\Delta T$) in the order of 10° C. from the thermal interface of a CCA to a cold wall of a chassis. While a metal to metal interface may be sufficient where CCA wattage is low, new designs of CCAs are dissipating progressively more heat as electronic devices become smaller and/or operate at higher speeds, rendering the metal to metal interface inadequate. As such, heat transferability breaks down or is insufficient, and performance of an electronic device in which they are used is adversely affected.

BRIEF DESCRIPTION OF THE INVENTION

In one aspect, a thermal interface is provided. The thermal interface material includes a thermally conductive metal having a first surface and an opposing second surface, a diffusion barrier plate coupled to the first surface of the thermally conductive metal and the second surface of the thermally conductive metal, and a thermal resistance reducing layer coupled to the diffusion barrier plate.

In another aspect a system is provided. The system includes a circuit card assembly, and a housing including a slot having an upper surface and lower surface. The slot is configured to receive the circuit card assembly between the upper surface and the lower surface. A shim is configured to reduce thermal resistance. The shim is coupled between the circuit card assembly and the upper surface of the slot. A board retainer secures the shim between the circuit card assembly and the upper surface of the slot.

In yet another aspect a method of forming a thermal interface material is provided. The method includes providing a layer of copper, providing a layer of nickel over the layer of copper, and providing a layer of indium over the layer of nickel.

BRIEF DESCRIPTION OF THE DRAWINGS

The present disclosure is described in detail below with reference to the attached drawing figures.

DETAILED DESCRIPTION OF THE INVENTION

Although the present disclosure describes a thermal interface material (TIM) between a circuit card assembly (CCA) and a chassis, aspects of the disclosure are operable with any apparatus that performs the functionality illustrated and described herein, or its equivalent. For example, and without limitation, the TIM described herein may be placed between a power supply unit and a base plate, a chassis and cooling fins, a chassis and a base plate, and the like.

Current thermal interfaces between a CCA and a chassis are metal to metal and do not include a TIM between the two metals. However, as mentioned above, a metal to metal interface may be sufficient where the overall CCA wattage is low. New designs of CCAs using electronic devices which are becoming smaller and/or operate at higher speeds emit a greater amount of energy and heat, rendering a metal to metal interface inadequate. For example, high performance conduction cooled CCAs are expected to run continuously with a temperature at a cold wall interface at 85° C. (typically, a processor manufacturer specifies an upper junction temperature limit of 105° C.). This leaves a difference in temperature ($\Delta T$) of 20° C. between a processor and a cold wall thermal interface. Trials of conventional CCAs with a 40 watt load on one of the two CCA metal to metal interfaces resulted in a $\Delta T$ of 7.9° C. across the metal to metal interface. This gives an approximate thermal resistance of 0.2° C./W across the interface. Thus, a CCA with a maximum load of 160 watts (80 watts per interface) would increase the $\Delta T$ to approximately 16° C., which may be problematic. However, unlike conventional systems that include, for example, a metal to metal interface between a CCA and a chassis and are only sufficient where a CCA wattage is limited, the TIM described herein reduces a thermal resistance at an interface by at least a factor of 10, and thus may be applied to a CCA with a load lower than 20 watts, as well as a CCA with a load greater than 160 watts.

Figure 1:
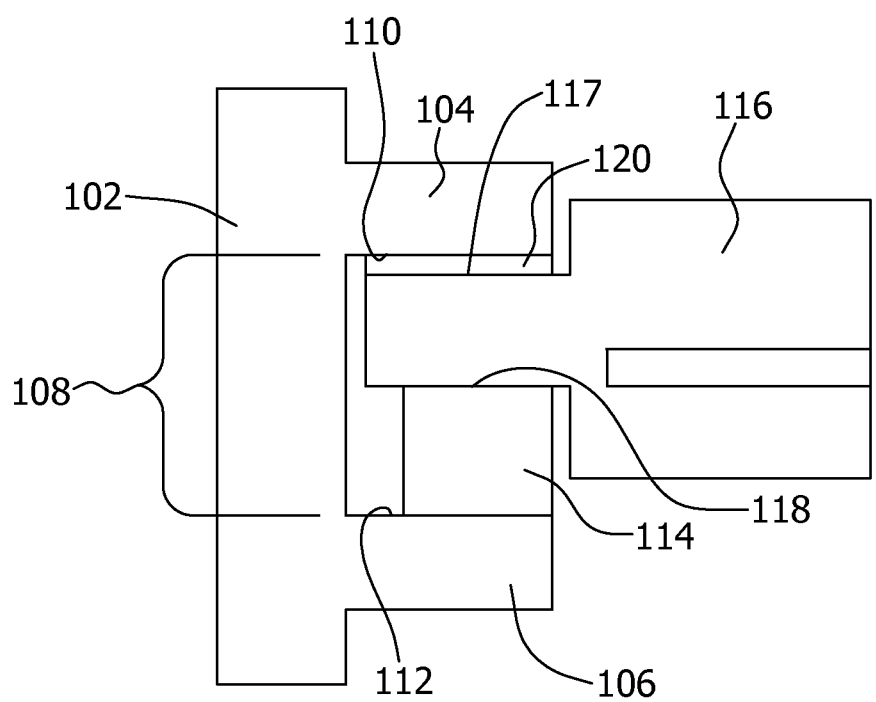
FIG. 1 shows a sectional end view of a CCA located in the cold wall of a chassis.

With reference now to FIG. 1, an end view of a housing (e.g., a chassis 102) for a CCA is shown. Chassis 102 includes cold walls 104 and 106 that form a slot 108 extending along a length of cold walls 104 and 106. Slot 108 has an upper surface 110 (e.g., a bottom surface of cold wall 104) and a lower surface 112 (e.g., an upper surface of cold wall 106). A board retainer, or any other suitable fixing mechanism, such as a wedgelock 114, is coupled between cold walls 104 and 106 and abuts lower surface 112. A CCA 116, and more specifically, a thermal interface surface 117 of CCA 116, is placed between an upper surface 118 of wedgelock 114 and upper surface 110 of slot 108. A TIM 120 (e.g., a shim) configured to reduce thermal resistance is coupled between thermal interface surface 117 and upper surface 110 of slot 108. Thermal interface surface 117 and TIM 120 are compressed between upper surface 110 of slot 108 and upper surface 118 of wedgelock 114. As described in further detail below, TIM 120 includes a plurality of layers. In some embodiments, each layer of the plurality of layers may include two or more layers.

In certain embodiments, wedgelock 114 is a mechanical fastener designed to secure CCA 116 and TIM 120 in slot 108 by expanding and applying contact pressure between CCA 116 and upper surface 110 of cold wall 106, via a plurality of individual wedges (not shown). For example, wedgelock 114 mechanically secures CCA 116 and TIM 120 in slot 108 by expanding the plurality of wedges using an expansion screw (not shown) and causing pressure to be applied between CCA 116 and upper surface 110 of slot 108.

TIM 120 conforms between two mating surfaces, thermal interface surface 117 and upper surface 110 of slot 108, and possesses a low bulk thermal resistance and low contact resistance. As will be described in greater detail below, to optimize thermal performance, TIM 120 includes an interface material and/or interface layer (e.g., indium) and is able to conform to non-planar surfaces and thereby lower contact resistance. TIM 120 also possesses a high thermal conductivity and a high mechanical compliance, yielding elastically when force is applied to TIM 120.

Figure 2:
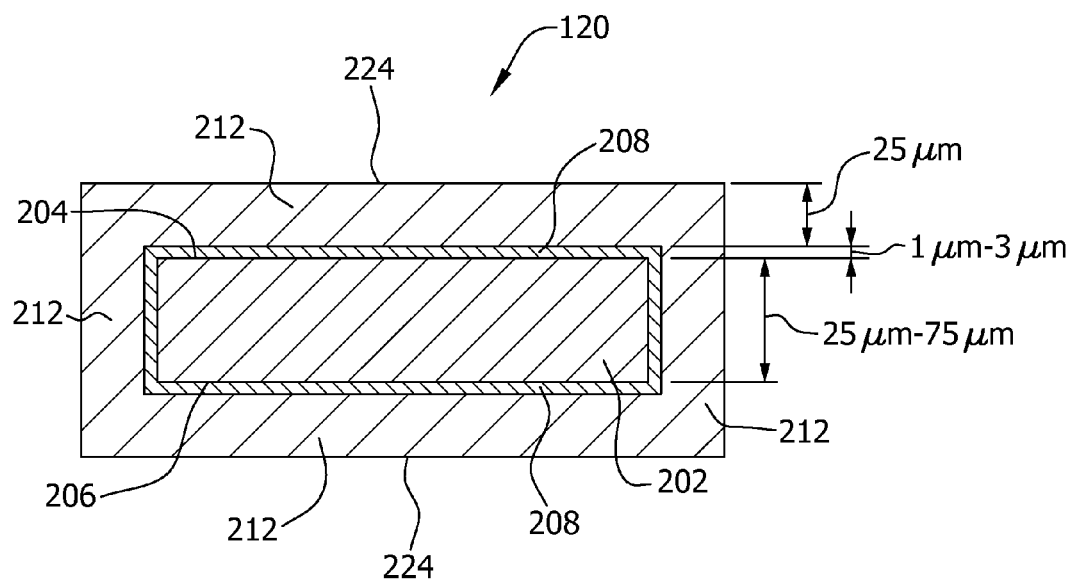
FIG. 2 is a sectional view of an exemplary thermal interface material taken along sectional line 2-2 shown in FIG. 4.

With reference now to FIG. 2, a sectional view of an exemplary TIM (e.g., TIM 120) is shown. TIM 120 includes a thermally conductive metal 202 having a first surface 204 and an opposing second surface 206, a diffusion barrier plate 208 that circumscribes (e.g., wraps around) thermally conductive metal 202, and a thermal resistance reducing layer 212 that circumscribes diffusion barrier plate 208.

As mentioned above, a suitable TIM should conform between two mating surfaces, as well as possess a low bulk thermal resistance and low contact resistance. Thus, thermal resistance reducing layer 212 includes a conforming metal, such as indium. However, due to the soft nature of indium, TIM 120 is layered with other metals to provide a more solid TIM while maintaining conductivity. For example, thermally conductive metal 202, such as copper, is provided as a stiffener, which enables TIM 120 to maintain a more solid form. However, due to the diffusing nature of copper and indium, nickel plating (e.g., diffusion barrier plate 208) acting as a diffusion barrier is provided between thermally conductive metal 202 (e.g., the copper layer) and thermal resistance reducing layer 212 (e.g., the layer of indium).

In some embodiments, thermal resistance reducing layer 212 has a thickness of about 25 microns ($\mu m$), thermally conductive metal has a thickness of about 25 $\mu m$ thick to about 75 $\mu m$, and diffusion barrier plate 208 has a thickness of about 1 $\mu m$ to about 3 $\mu m$.

Figure 3:
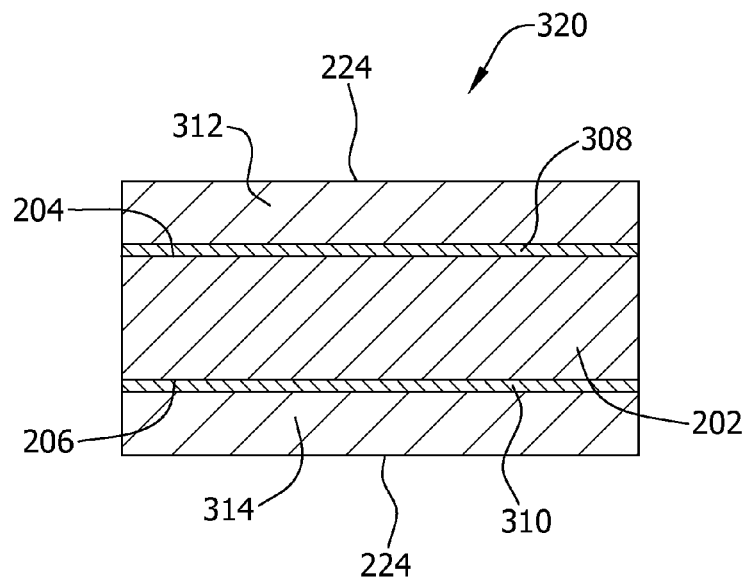
FIG. 3 is a sectional view of an alternative thermal interface material.

With reference now to FIG. 3, an alternative TIM 320 is shown. TIM 320 includes a first thermal resistance reducing layer 312 coupled to a first diffusion barrier plate 308 and a second thermal resistance reducing layer 314 coupled to a second diffusion barrier plate 310. In this embodiment, first thermal resistance reducing layer 312 and second thermal resistance reducing layer 314 are separated by thermally conductive metal 202, first diffusion barrier plate 308, and second diffusion barrier plate 310.

Figure 4:
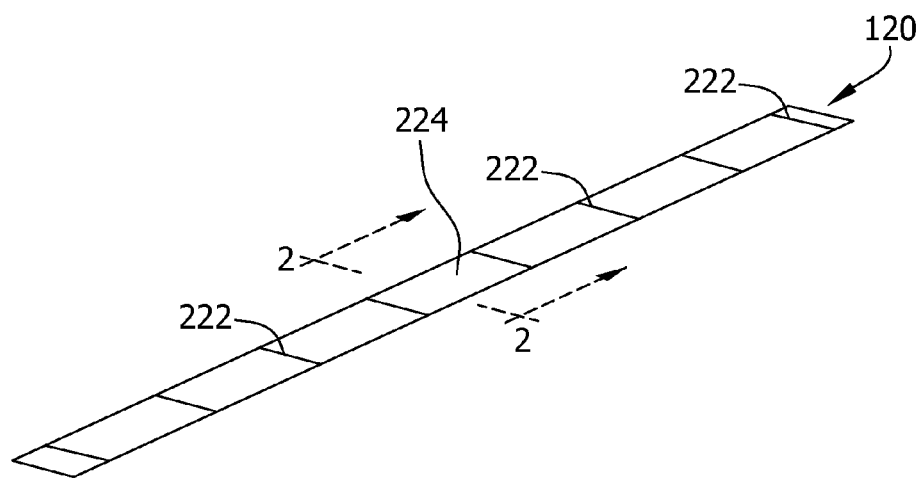
FIGS. 4 and 5 show exemplary adhesive applications to a surface of a thermal interface material.
Figure 5:
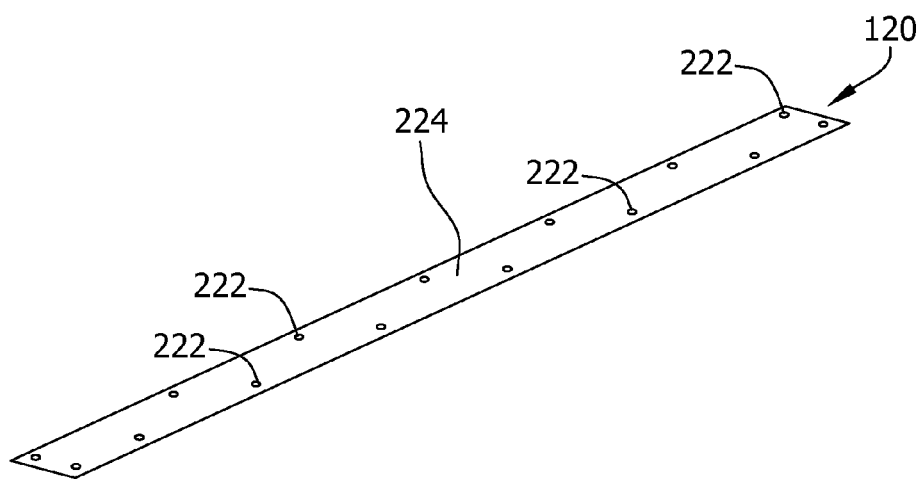

In some embodiments, an adhesive layer 222 is applied to at least one outer surface 224 of TIM 120. However, a complete surface layer of an adhesive may impede a flow of heat through TIM 120 and thus increase a thermal resistance of TIM 120. Thus, adhesive layer 222 may be applied to TIM 120 in a striped pattern, as shown in FIG. 4, or an array/grid pattern, as shown in FIG. 5. Further, an adhesive layer that is too thick may impede TIM 120 from properly conforming to thermal interface surface 117 of CCA 116 or upper surface 110 of cold wall 106. Thus, in some embodiments, adhesive layer 222 includes a layer of adhesive that has a thickness of about 5 $\mu m$ to about 25 $\mu m$.

In some embodiments, adhesive layer 222 is used to temporarily attach TIM 120 to thermal interface surface 117, prior to TIM 120 being secured between CCA 116 and upper surface 110 of cold wall 106 via wedgelock 114. Further, because adhesive layer 222 is sacrificial, adhesive layer 222 includes a low tack adhesive that enables TIM 120 to be easily removed from CCA 116 and upper surface 110 of cold wall 106, leaving thermal interface surface 117 clean for a replacement TIM.

Figure 6:
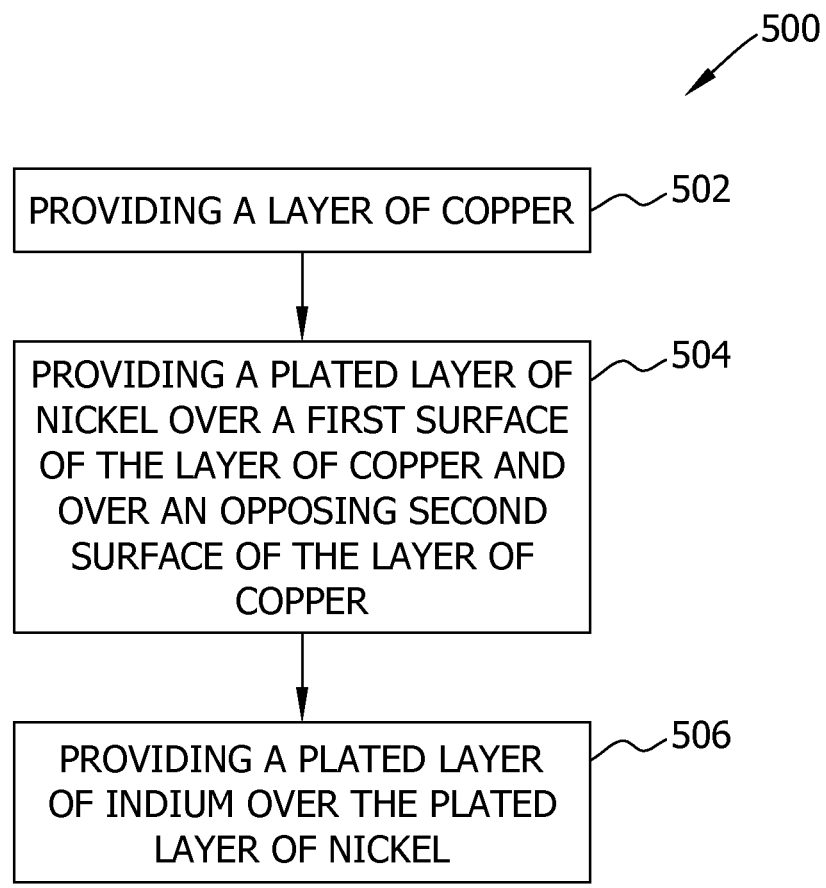
FIG. 6 is a flow chart of an exemplary process of forming a thermal interface material.

With reference now to FIG. 6, a flow chart of an exemplary process of forming a TIM is shown, and referenced generally as process 500. Process 500 includes providing a layer of copper at 502, providing a plated layer of nickel over the layer of copper at 504, and providing a plated layer of indium over the plated layer of nickel at 506. In some embodiments, the plated layer of nickel is provided such that the plated layer of nickel circumscribes the layer of copper. In further embodiments, the plated layer of indium is provided such that the plated layer of indium circumscribes the plated layer of nickel. In other embodiments, a first plated layer of nickel is provided over a first surface of the layer of copper, and a second plated layer of nickel is provided over an opposing second side of the layer of copper. In other embodiments, a first plated layer of indium is provided over the first plated layer of nickel and a second plated layer of indium is provided over the second plated layer of nickel, with each of the first plated layer of indium and the second plated layer of indium being separated by the first plated layer of nickel, the layer of copper, and the second plated layer of nickel.

Figure 7:
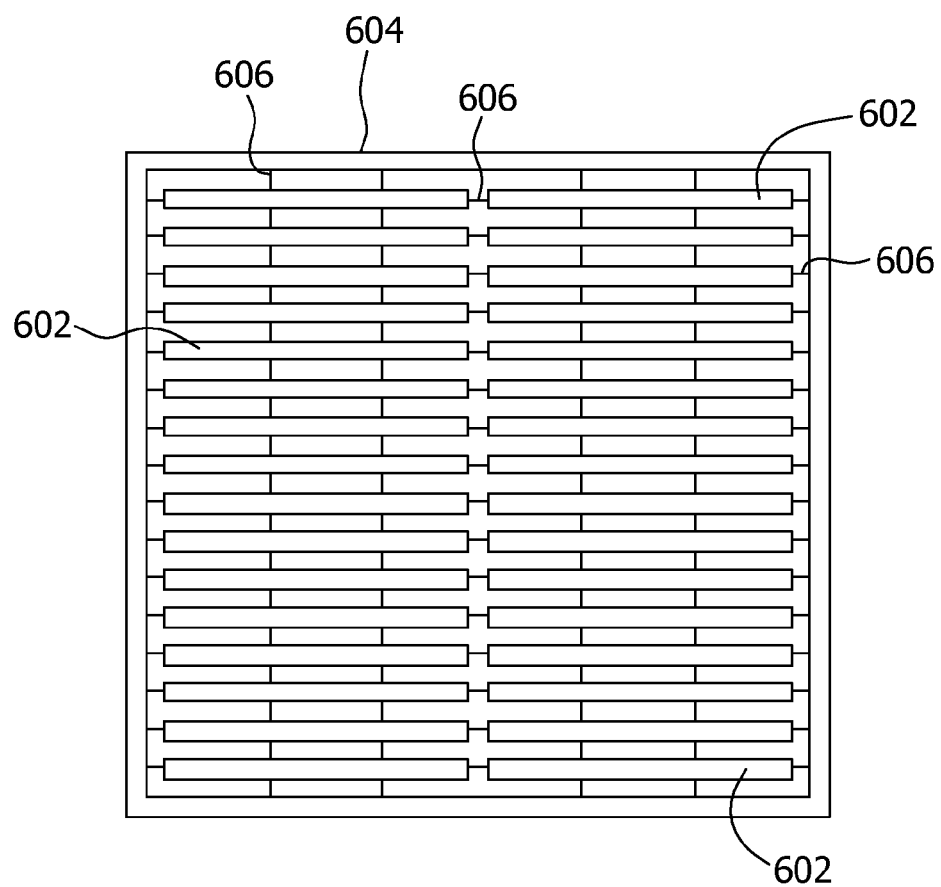
FIG. 7 shows a plurality of shims etched from a copper foil frame.

In some embodiments, a plurality of shims 602 are chemically etched from, for example, 37.5 $\mu m$ copper foil and held in a frame 604 by tabs 606 (see FIG. 7). As such, shapes, sizes, and holes can be easily accommodated by simply altering the photowork. Shims 602 can also be laser cut, enabling shapes, sizes, and holes to be changed via software. After shims 602 are etched, frame 604 is preconditioned for plating. A layer of nickel (e.g., approximately 3 $\mu m$ thick) is plated onto all surfaces of shims 602 to act as a barrier between copper and indium as indium readily diffuses into copper resulting in a hard brittle alloy. Next, a layer of indium (e.g., approximately 25 $\mu m$ to about 30 $\mu m$ thick) is plated over the nickel barrier.

Next, adhesive layer 222 may be applied to at least one side of the plurality of shims 602. A tack adhesive may come in reel form on a backing sheet, and thus, the adhesive can either be laser cut to produce a striped pattern or an array/grid pattern (as shown in FIGS. 4 and 5, respectively) or a thin mask can be cut which lays over the reel of the tack adhesive exposing an array/grid pattern or a striped pattern. The adhesive layer is laid onto each of the plurality of shims 602 by hand with a backing sheet left in place to protect the tack adhesive. One of ordinary skill in the art will appreciate that this process can be automated if quantities permit. Finally, the plurality of shims 602 can either be left on frame 604 or cut out as required.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A thermal interface material comprising:
   a thermally conductive metal;
   a diffusion barrier plate coupled to the thermally conductive metal; and
   a thermal resistance reducing layer directly coupled to the diffusion barrier plate, wherein the thermal resistance reducing layer substantially circumscribes the thermal interface material.

2. The thermal interface material in accordance with claim 1, wherein the thermal resistance reducing layer comprises a conforming metal.

3. The thermal interface material in accordance with claim 2, wherein the conforming metal is indium.

4. The thermal interface material in accordance with claim 1, wherein the thermally conductive metal is copper.

5. The thermal interface material in accordance with claim 1, wherein the diffusion barrier plate comprises nickel.

6. The thermal interface material in accordance with claim 1, wherein the diffusion barrier plate circumscribes the thermally conductive metal.

7. The thermal interface material in accordance with claim 1, wherein the thermally conductive metal has a thickness of about 25 μm thick to about 75 μm, the diffusion barrier plate has a thickness of about 1 μm to about 3 μm, and the thermal resistance reducing layer has a thickness of about 25 μm.

8. The thermal interface material in accordance with claim 1, further comprising an adhesive layer coupled to the thermal resistance reducing layer such that the adhesive layer is disposed on at least one outer surface of the thermal interface material.

9. The thermal interface material in accordance with claim 8, wherein the adhesive layer is disposed on the at least one outer surface of the thermal interface material in at least one of an array pattern, a grid pattern, and a striped pattern.

10. A thermal interface material comprising:
    a thermally conductive metal;
    a diffusion barrier plate coupled to the thermally conductive metal;
    a thermal resistance reducing layer directly coupled to the diffusion barrier plate; and
    an adhesive layer coupled to the thermal resistance reducing layer such that the adhesive layer is disposed on at least one outer surface of the thermal interface material in at least one or more of the following: an array pattern, a grid pattern, and a striped pattern.

11. The thermal interface material in accordance with claim 10, wherein the thermal resistance reducing layer comprises a conforming metal.

12. The thermal interface material in accordance with claim 11, wherein the conforming metal is indium.

13. The thermal interface material in accordance with claim 10, wherein the thermally conductive metal is copper.

14. The thermal interface material in accordance with claim 10, wherein the diffusion barrier plate comprises nickel.

15. The thermal interface material in accordance with claim 10, wherein the diffusion barrier plate circumscribes the thermally conductive metal.

16. The thermal interface material in accordance with claim 10, wherein the thermal resistance reducing layer circumscribes the thermal interface material.

17. The thermal interface material in accordance with claim 10, wherein the thermally conductive metal has a thickness of about 25 μm thick to about 75 μm, the diffusion barrier plate has a thickness of about 1 μm to about 3 μm, and the thermal resistance reducing layer has a thickness of about 25 μm.

* * * * *